United States Patent
Balakrishnan et al.

(10) Patent No.: US 9,491,012 B1
(45) Date of Patent: Nov. 8, 2016

(54) DIRECT OVER-SAMPLED PULSE SHAPING CIRCUIT WITH FLIP FLOPS AND LUT

(71) Applicant: Texas Instruments Incorporated, Dallas, TX (US)

(72) Inventors: Jaiganesh Balakrishnan, Bangalore (IN); Sriram Murali, Bangalore (IN); Sundarrajan Rangachari, Trichy (IN); Sarma Sundareswara Gunturi, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/745,349

(22) Filed: Jun. 19, 2015

(51) Int. Cl.
*H04L 25/03* (2006.01)
*H04B 1/04* (2006.01)

(52) U.S. Cl.
CPC ........... *H04L 25/03859* (2013.01); *H04B 1/04* (2013.01)

(58) Field of Classification Search
CPC .................... H04L 25/03859; H04B 1/04
See application file for complete search history.

(56) References Cited

U.S. PATENT DOCUMENTS

| 2004/0223553 | A1* | 11/2004 | Kumar | H04L 1/0059 375/259 |
| 2011/0138259 | A1* | 6/2011 | Tan | H03M 13/41 714/792 |
| 2012/0294396 | A1* | 11/2012 | Desai | H04L 5/0062 375/343 |
| 2014/0341201 | A1* | 11/2014 | Ibrahim | H04W 4/001 370/338 |

* cited by examiner

*Primary Examiner* — Freshteh N Aghdam
(74) *Attorney, Agent, or Firm* — Lawrence J. Bassuk; Frank D. Cimino (57) ABSTRACT

Example embodiments of systems and methods of direct oversampled low PAR pulse shaping encapsulating DSSS spreading are disclosed herein. Pulse-shaping of a DSSS spread data symbol stream results in a small number of waveform patterns to choose from for any data-symbol window. Low complexity programmable look-up table (LUT) based direct pulse shaping may be implemented, while only needing to compute a negation function. The chosen pulse shape may generate a low PAR for the baseband signal, allowing for a reduction in the saturation power of the power amplifier, thereby reducing the overall transmitter power consumption.

4 Claims, 5 Drawing Sheets

DIRECT OVER-SAMPLED PULSE SHAPING CIRCUIT WITH FLIP FLOPS AND LUT

TECHNICAL FIELD

The present disclosure is generally related to telecommunications and, more particularly, is related to digital baseband transmitters.

BACKGROUND

Data transmission systems that operate in a bandwidth-limited environment contend with the fact that constraining the bandwidth of the transmitted signal increases the likelihood of a decoding error at the receiver due to inter-symbol interference (ISI). Single-carrier communication systems often employ pulse-shaping techniques that allow for bandwidth containment while minimizing the likelihood of errors at the receiver.

In many data transmission applications, the transmitted signal is restricted to a certain bandwidth due to system design constraints or due to government regulation. Pulse shaping is a spectral processing technique by which fractional out of band power is reduced for efficient, reliable, single-carrier communication. Pulse shaping filters reduce ISI and Adjacent Channel Interference (ACI). The design and analysis of a transmit pulse shaping filter is an important aspect of digital wireless communication since it has a direct effect on spectral emissions and ISI.

Wireless communication systems, such as Wireless LAN, contend with impairments such as multipath propagation and channel fading. Multi-carrier modulation schemes, such as Orthogonal Frequency Division Multiplexing (OFDM) as employed in IEEE 802.11g/n achieve high spectral efficiency for moderate to high signal to noise ratios (SNRs) over such channels. However, many wireless systems still support more rudimentary single-carrier modulation modes for basic low data rate, low SNR (thus, high range) connectivity. In order to tackle the problems of multi-path and fading, single-carrier modulation may be coupled with a spread-spectrum technique such as the Direct Sequence Spread Spectrum (DSSS) scheme used in the IEEE 802.11b/g/n WLAN standard.

A square-root raised cosine (RRC) filter, for example, may be used as a typical pulse-shaping filter to conform to the spectral mask requirements of the IEEE 802.11b standard. Implementation of the pulse shaping filter after Barker encoding (the DSSS spreading used in the IEEE 802.11b standard) the data symbol stream and any subsequent re-sampling/up-sampling are power hungry computations in the digital transmitter baseband.

The saturation power ($P_{sat}$) requirement of the Power Amplifier (PA) is another factor affecting the power consumption of a transmitter. The PA amplifies a frequency up-converted base-band signal for transmission using an antenna. Typically, the PA is the most power-hungry block in the transmitter sub-system, and the power consumption of the PA directly increases as the desired $P_{sat}$ increases. The $P_{sat}$ requirement of the PA for a particular modulation mode is in turn driven by two factors: the targeted maximum transmit power ($P_{max}$), and the Peak-to-Average Ratio (PAR) of the base-band signal being modulated. Typically, an equation of the following form holds:

$$P_{sat} = P_{max} + PAR + Margin$$

The overall $P_{sat}$ requirement for the system may be determined by the maximum of the requirements from each modulation mode, and typically in 802.11b WLAN, the $P_{sat}$ requirement from the single carrier modulation modes dominates. This implies that one way of reducing the required $P_{sat}$ (and hence the PA power) for a given $P_{max}$, is to reduce the PAR of the baseband signal. Techniques to lower the power consumption and minimize the PAR of these operations may be used to solve heretofore unaddressed needs with previous solutions.

SUMMARY

Example embodiments of the present disclosure provide systems of direct oversampled pulse shaping. Briefly described, in architecture, one example embodiment of the system, among others, can be implemented as follows: a pulse shaper configured to receive a modulated data symbol stream and to apply a direct over-sampled pulse shaping scheme encapsulating Direct Sequence Spread Spectrum (DSSS) spreading, using a lookup table (LUT), to the data symbol stream to produce an oversampled baseband signal at a desired sampling rate; and a transmitter configured to transmit the oversampled baseband signal.

Embodiments of the present disclosure can also be viewed as providing methods for direct oversampled pulse shaping. In this regard, one embodiment of such a method, among others, can be broadly summarized by the following steps: receiving a data symbol stream; applying a direct over-sampled pulse shaping scheme encapsulating Direct Sequence Spread Spectrum (DSSS) spreading, using a lookup table (LUT), to the data symbol stream to produce an oversampled baseband signal at a desired sampling rate; and transmitting the oversampled baseband signal.

DETAILED DESCRIPTION

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples. Specifically, the IEEE 802.11b system is used throughout merely as an example, and the ideas presented are applicable to other single carrier systems as well.

Figure 1:
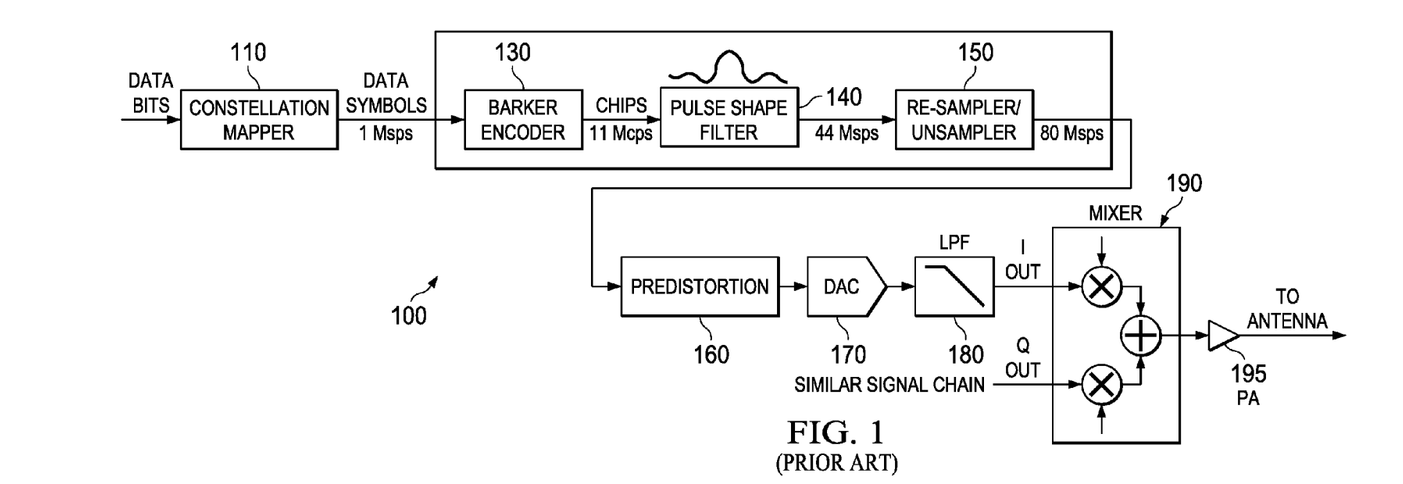
FIG. 1 is a block diagram of a typical IEEE 802.11 digital transmitter for DSSS (1 Mbps and 2 Mbps) modes.

As provided in FIG. 1, in typical example IEEE 802.11b WLAN transmitter system 100, a data bit stream is received by constellation mapper 110, which produces a data stream symbol. The data symbol stream is fed to Barker encoder 130 at a symbol rate of 1 mega samples per second (Msps). Barker encoder 130 performs DSSS spreading on the data symbol stream with, typically, an 11 chip Barker code such that the signal power is spread over a wider bandwidth. The output of the Barker encoder is then sent to pulse shaping filter 140 and re-sampler/up-sampler 150. The output of re-sampler/up-sampler 150 is typically pre-distorted by pre-distortion block 160 before being converted to an analog waveform by Digital-to-Analog Converter (DAC) 170. The output of DAC 170 is low-pass filtered by LPF 180, up-converted to the appropriate frequency band by mixer 190, and amplified by Power Amplifier (PA) 195 for transmission through an antenna.

Pulse shape filter 140 and re-sampler/up-sampler 150 are some of the last few stages before DAC 170 and, therefore, the data rates through these blocks are relatively high. Programmable FIR filters are typically employed for pulse shaping and re-sampling/up-sampling to enable flexibility in EVM and spectral mask compliance. These filters are power hungry at these high data rates. Power reduction of these blocks would lead to a significant reduction of the overall power of the transmitter.

Figure 2:
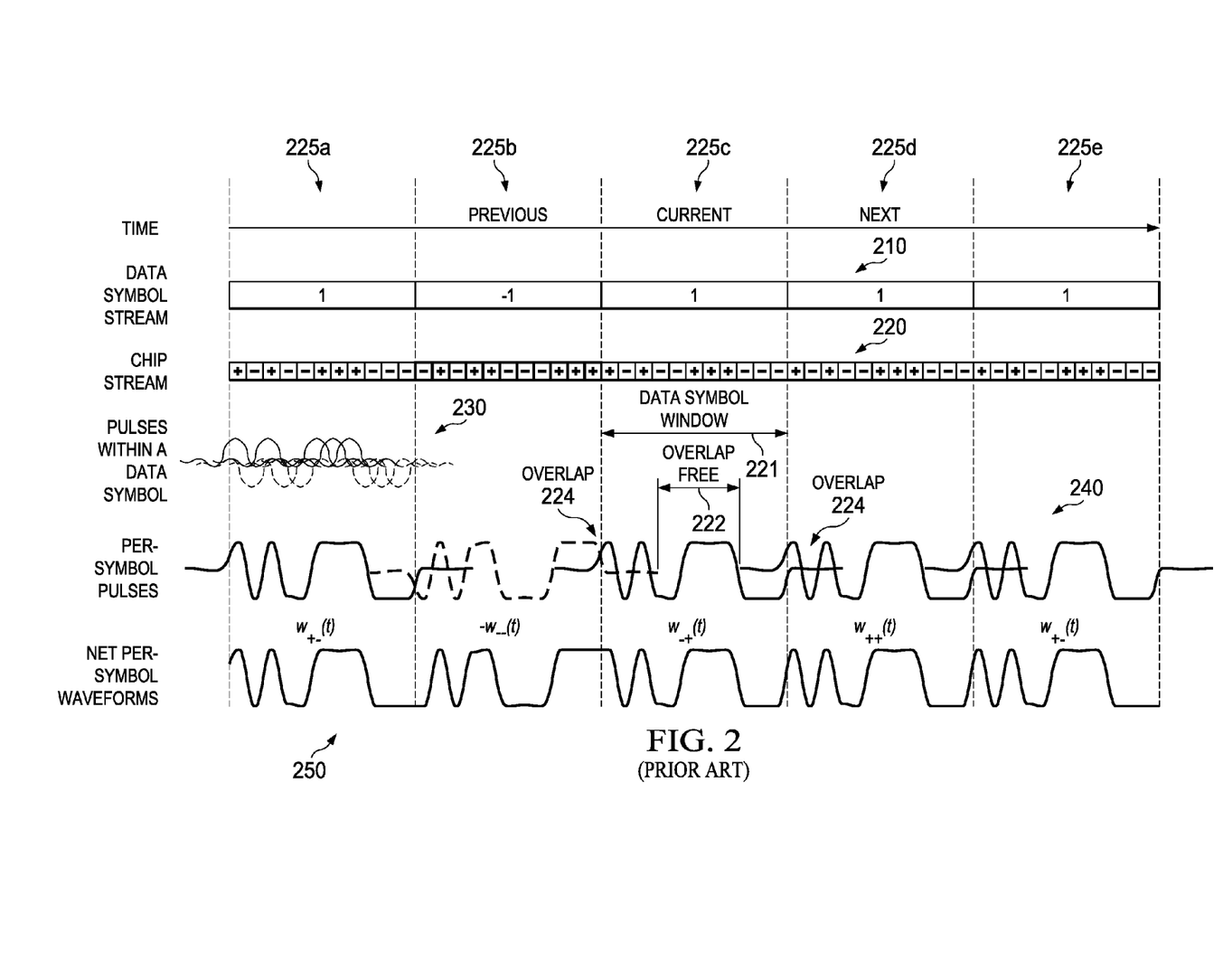
FIG. 2 is a signal diagram of an example data stream processed through DSSS spreading and pulse-shaping techniques in the typical digital transmitter of FIG. 1.

Example embodiments of the systems and methods of direct oversampled pulse shaping disclosed herein exploit, as shown in FIG. 2, the fact that net DSSS spread, pulse-shaped output waveform 250 is determined directly by data symbol stream 210 and the per-symbol pulse shape obtained by pre-convolving the desired per-chip pulse-shape with the chip sequence of spreading code 220. A typical design of the per-chip pulse-shaping filter spans 7 to 9 chip periods. As such, even with inter-data-symbol overlap taken into account, there are a small number of time domain waveforms to choose from for any particular data-symbol window 221 in the overall waveform as shown with signals 240 and 250.

The Barker sequence is defined in the IEEE 802.11b standard as a known 11-chip pattern, and, for a given choice of the pulse shape (left to the designer), the Barker sequence, convolved with the pulse shape, is also deterministic. The overall convolved pulse-shape may be present either as a positive or a negative version for each data symbol period, depending on the data in the data symbol stream, as shown with signal 240.

As an example, in an 802.11b direct spread spectrum (DSSS) 1 Mbps mode, the pulse-shaped output waveform pattern in any 1 μs data symbol window 225a-225e may be one of eight possibilities if overlap region 224 between the per-symbol pulse-shapes across data symbol windows is limited, for any particular data symbol window 221, to the immediately preceding (previous) and immediately following (next) data symbol windows as shown with signal 240. The 2 Mbps mode is similar, but with the In-phase (I) and Quadrature (Q) data symbol streams treated in parallel. For simplicity of presentation, only the I-arm signal chain will be described in detail in the following paragraphs.

Mathematically, let $p_c(t)$ denote the centered impulse response of the chosen pulse shape to be used on the DSSS encoded chip stream, with a chipping time period $T_c$. In IEEE 802.11b, $p_c(t)$ is left unspecified, and the chipping rate, $1/T_c$, is specified to be 11 MHz, so that the chipping period is $T_c = 1/11$ μs. Let $b(l)$, $-L \le l \le L$, denote the centered (2L+1)-chip spreading code sequence. In IEEE 802.11b, L=5 and [b(−5), b(−4), . . . , b(0), . . . , b(4), b(5)] is the 11-chip Barker sequence. The per-data-symbol centered pulse-shape, $p_s(t)$ may be defined as the convolved version of the spreading sequence b(l) with the per-chip pulse shape $p_c(t)$:

$$p_s(t) = \sum_{l=-L}^{L} b(l) p_c(t - lT_c)$$

The data symbol period $T_{baud}$ is an integer multiple of the chipping period $T_c$, with their ratio being the length of the spreading code. In IEEE 802.11b, $T_{baud} = 1$ μs while $T_c = 1/11$ μs. The inverse of the data symbol period, $1/T_{baud}$, is also referred to as the Baud rate or symbol rate, and in IEEE 802.11b, this equals $F_{baud} = 1/T_{baud} = 1$ MHz.

With this definition, the pulse-shaped output waveform for a data symbol sequence d(n) is given by the expression:

$$s(t) = \sum_{n=-\infty}^{\infty} d(n) p_s\left(\left(t - \frac{T_{baud}}{2}\right) - nT_{baud}\right)$$

For typical choices of $p_c(t)$ and typical spreading codes b(l), the span of the per-data-symbol pulse shape $p_s(t)$ may be a few data symbol periods. That is, it is reasonable to expect: that $$p_s\left(t - \frac{T_{baud}}{2}\right) = 0 \text{ outside } -PT_{baud} \le t < (P+1)T_{baud}$$

where P is a small positive integer value, such as 1. If this constraint is satisfied, the output waveform s(t) in the nth data symbol duration window $nT_{baud} \le t \le (n+1)T_{baud}$ may be determined by the per-symbol pulse shape $p_s(t)$ and the 2P+1 data symbol values d(n−P), d(n−P+1), . . . , d(n), . . . d(n+P−1) and d(n+P). For ease of presentation, the specific typical case of P=1 will be described in detail in the following paragraphs, without implying any restrictions.

For the specific typical case of P=1, the output waveform in any data symbol duration may depend on three data symbols, namely, the previous, current and next data symbols d(n−1), d(n) and d(n+1) respectively, and therefore, for binary data symbols d(n)=±1, there are eight waveform patterns to choose from for any particular data symbol duration, for a given $p_s(t)$ (which is, in turn, uniquely specified by a specific choice of $p_c(t)$ and the spreading code b(l)).

Four of these eight waveform patterns correspond to four possible data symbol sequences of the form {previous, current, next} where current=+1 (positive) and previous and next are either +1 or −1. These four sequences may be referred to as current-positive sequences, and the corresponding waveforms in the current symbol duration window may be referred to as current-positive waveforms. Specifically, with X=±1 (previous) and Y=±1 (next), the four possible current-positive waveforms may be:

$$w_{XY}(t) = \begin{cases} \left[ X * p_s\left(t - \frac{T_{baud}}{2} + T_{baud}\right) + p_s\left(t - \frac{T_{baud}}{2}\right) + \right. \\ \left. Y * p_s\left(t - \frac{T_{baud}}{2} - T_{baud}\right) \right], & 0 \leq t < T_{baud} \\ 0, \text{ elsewhere} \end{cases}$$

where each of the four current-positive waveforms (occurring in one of 225a-225e of FIG. 2) has a time span of one data symbol duration equal to $T_{baud}$.

The remaining four patterns correspond to negatives of these symbol sequences: {−previous, current, −next} where current=−1 (negative) and previous and next are either −1 or +1. These four sequences may be referred to as current-negative sequences and the corresponding waveforms in the current symbol duration window may be referred to as current-negative waveforms. Example current-positive and current-negative waveforms are shown in signal 250 of FIG. 2.

In an example embodiment of the disclosed systems and methods, when the desired sampling rate of the pulse shaped signal $F_s$ is an integer multiple of the baud rate $F_{baud}$, the four current-positive waveform samples are pre-computed and stored at the desired sampling rate in a lookup table (LUT).

For instance, if $F_s = RF_{baud} = Ra_{baud}$, the following four R-length sampled current-positive waveforms may be stored in the LUT (with X=±1 (previous) and Y=±1 (next) as before):

$$v_{XY}[m] = w_{XY}\left(\frac{m}{F_s}\right) = w_{XY}\left(\frac{m}{R}T_{baud}\right), 0 \leq m < R$$

Each of the four current-negative waveform patterns for the four current-negative data symbol sequences may be obtained by negating a corresponding waveform of a corresponding current-positive data symbol sequence. Specifically, the current-negative waveform for the current negative sequence {1, −1, 1} may be obtained by negating the current-positive waveform for the corresponding negated current-positive sequence {−1, 1, −1}.

Figure 3:
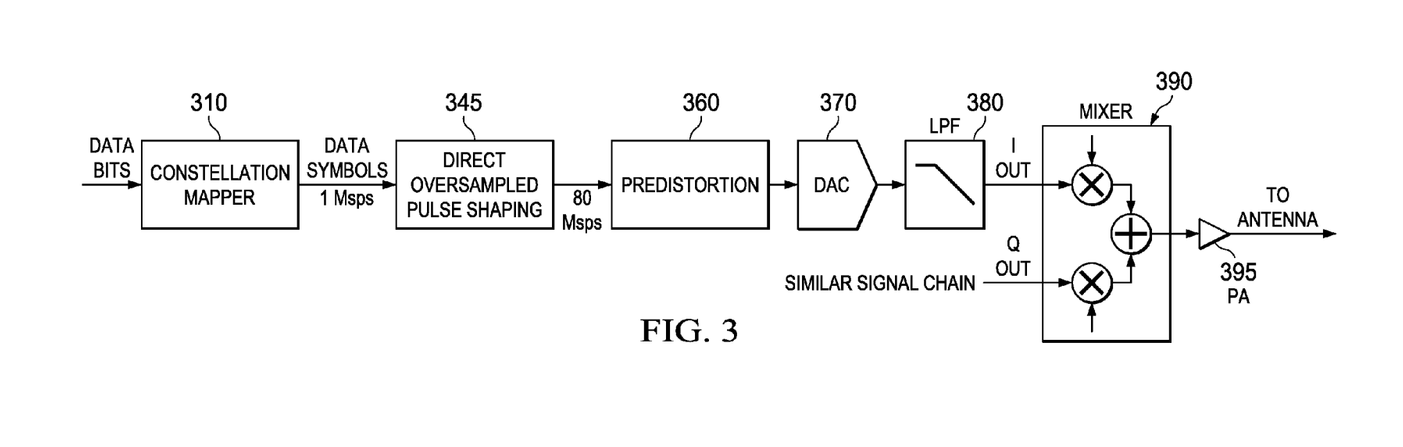
FIG. 3 is a block diagram of an example embodiment of a system of direct oversampled pulse shaping in an IEEE 802.11b digital transmitter.

Since the eight possible waveforms for any given data symbol window are available either as a direct look-up or a look-up followed by negation, the filter and re-sampler/up-sampler blocks of FIG. 1 are thereby obviated in FIG. 3, by directly storing and using the current-positive waveforms at an over-sampled rate, such as $F_s=80$ Msps, in an example implementation. Example embodiments of the systems and methods disclosed herein implement a programmable LUT based direct pulse shaping, implementing a negation function when the current data symbol is negative.

In disclosed example embodiments, as shown in FIG. 3, direct, oversampled pulse shaping that encapsulates the DSSS spreading, pulse shaping filter and re-sampler may be enabled for the 1 and 2 Mbps 802.11b rates, in an example non-limiting implementation. The 5.5 and 11 Mbps 802.11 rates employ CCK encoding and result in a nearly random stream at 11 Mbps, with no patterns exploitable for low-complexity direct pulse-shaping.

In this example, even though there are eight possible wave forms for any data symbol duration, four of the possible wave forms are negative versions of the other four wave forms in that data symbol period. So, the waveform corresponding to {1, −1, 1} would just be the negative version of the waveform corresponding to {−1, 1, −1}. Allowing for an overall negation, only the four possible current-positive waveforms are stored. Additionally, there is also typically an overlap-free middle region (such as overlap free region 222) in each data symbol duration as can be seen in per-symbol pulse stream 240 in FIG. 2. The waveform in this middle region is only determined by the current data symbol value. This fact may also be exploited in optimizing the storage of the four possible current-positive waveforms by only storing one version for the middle region, and keeping two versions for each of the two edge (overlap) regions. Two versions are stored for each of the two edge regions because the waveform in each such region (left and right overlap regions 224) is determined by two data symbols each: the previous and the current data symbols for the left overlap region, and the current and the next data symbols for the right overlap region.

In example embodiments of the systems and methods of direct oversampled pulse shaping disclosed herein, a data symbol stream that is received at 1 Msps may be directly referenced against a lookup table based structure that encapsulates Barker encoding and pulse shaping, and directly produces samples at a desired output rate. The lookup table in 802.11b may have just four entries. These look up table entries may be directly available at an output sampling rate of 80 Msps, as a non-limiting example. In this example, each entry in the lookup table is an 80-sample waveform.

Figure 4:
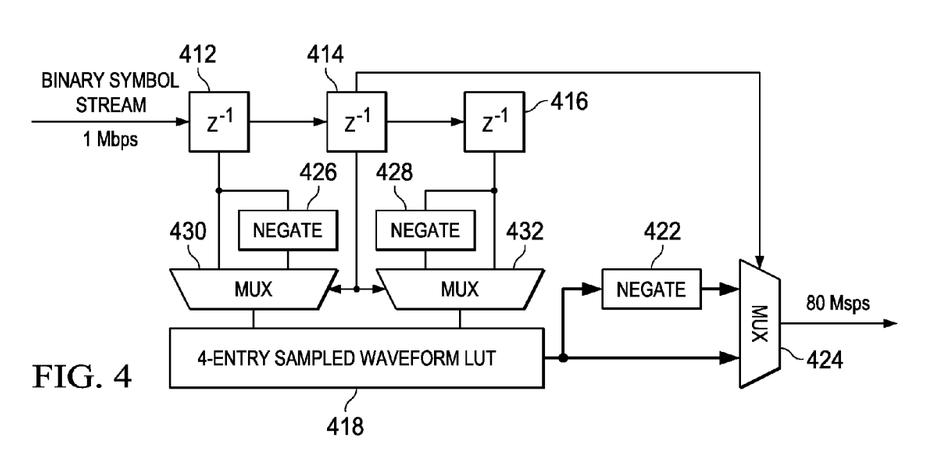
FIG. 4 is a block diagram of an example embodiment of the direct oversampled pulse shaping block of FIG. 3 in which the desired sampling rate of the pulse shaped stream is related to the data symbol rate (baud rate) by an integer scale-factor.

In an example implementation, the output sampling rate $F_s$ is an integer multiple of the input data symbol (baud) rate $F_{baud}$. The value of the previous data symbol, current data symbol, and the next data symbol formulate one of the four entries or the negative version of one of the four entries leading to no computation other than the negation function. FIG. 4 provides an example embodiment of a direct oversampled pulse shaping circuit for a 1 Msps data symbol stream, with flip flop 416 passing the previous symbol and its negated version to multiplexer (MUX) 432, and flip flop 412 passing the next symbol and its negated version to MUX 430, with the MUX outputs being passed to LUT 418. Multiplexers 430 and 432 select the negative versions of their respective inputs when the current symbol passed from flip flop 414 is negative. Flip flop 414 also passes the current symbol as the sign bit to MUX 424. The appropriate waveform is sent from LUT 418 to MUX 424 along with the negative waveform after being negated by negate block 422. MUX 424 selects the appropriate waveform from the positive and negative waveforms based on the current symbol passed from flip flop 414.

In an alternative embodiment, output sampling rate $F_s$ is not an integer multiple of the data symbol (baud) rate $F_{baud}$, but is a rational multiple of the data symbol (baud) rate: $F_s = (R/M)F_{baud}$ with (R/M)>1. (R/M) is the rational number represented with no common factors between R and M, that is gcd(R, M)=1, where gcd is the Greatest Common Divisor. Under this condition, $$\frac{F_s}{F_{baud}} = \frac{R}{M} = Q + \frac{r}{M} \text{ with } 0 < r < M \text{ and } \gcd(r, M) = 1$$

In an example, with $F_{baud}=1/T_{baud}=1$ MHz, and $F_s=80.7$ MHz, $$\frac{F_s}{F_{baud}} = 80.7 = \frac{R}{M} = 80 + \frac{7}{10} = Q + \frac{r}{M}$$

For the n=0th data symbol window, without loss of generality, the following four sampled versions of the four current-positive waveforms are stored:

$$v_{XY}^0[m] = w_{XY}\left(\frac{m}{F_s}\right) = w_{XY}\left(\frac{mM}{R}T_{baud}\right), 0 \le m \le Q$$

Using the modulo operator notation for integers, a mod b=r denotes the non-negative integer remainder r obtained when integer a is divided by integer b. Note that with this definition, when r=a mod b, 0≤r<b. Thus, for example, 0 mod 7=0, 12 mod 9=3, and −13 mod 5=2.

For the n=1st data symbol window, since the symbol period $T_{baud}$ is not an integer multiple of the sampling period $T_s=1/F_s$, the following "sampling phase offset" sampled versions of the four current-positive waveforms are chosen from:

$$v_{XY}^1[m] = w_{XY}\left(\left(\frac{(-r)\mathrm{mod}M}{M}\right)\frac{1}{F_s} + \frac{m}{F_s}\right) = w_{XY}\left(\left(\frac{(-r)\mathrm{mod}M + mM}{R}\right)T_{baud}\right),$$

$$0 \le m \le m_{max}$$

Here, $m_{max}$ is Q−1 or Q, and is determined by using all samples from a time window corresponding to one data sample duration, which is equivalent to the inequality $$\left(\frac{(-r)\mathrm{mod}M + Mm_{max}}{R}\right) < 1,$$

which may be used to arrive at $$m_{max} = \mathrm{floor}\left(Q - 1 + \frac{M + r - ((-r)\mathrm{mod}M)}{M}\right)$$

where floor(x) is the greatest integer smaller than or equal to x.

In general, for the nth data symbol window, define p=n mod M, so that 0≤p<M. Then, for the nth data symbol window, the pth set of "sampling phase offset" sampled versions of the four current-positive waveforms, defined as below, would be:

$$v_{XY}^p[m] = w_{XY}\left(\left(\frac{(-pr)\mathrm{mod}M}{M}\right)\frac{1}{F_s} + \frac{m}{F_s}\right) =$$

$$w_{XY}\left(\left(\frac{(-pr)\mathrm{mod}M + mM}{R}\right)T_{baud}\right), 0 \le m \le m_{max}(p)$$

Here, $m_{max}(p)$ is Q−1 or Q, and is determined by using all samples from a time window corresponding to one data sample duration, which is equivalent to the inequality $$\left(\frac{(-pr)\mathrm{mod}M + Mm_{max}(p)}{R}\right) < 1,$$

which may be used to arrive at the following equation for $m_{max}(p)$:

$$m_{max} = \mathrm{floor}\left(Q - 1 + \frac{M + r - ((-pr)\mathrm{mod}M)}{M}\right)$$

The fact that gcd(r, M)=1 ensures that for 0≤p<M, (−pr) mod M covers each of the M values 0, 1, 2, . . . , M−1, in a specific permuted order depending on r and M. The r values of p result in $m_{max}(p)=Q$, and the remaining M−r values of p result in $m_{max}(p)=Q-1$. Thus, there are exactly r sampling phases resulting in sampled waveforms of length Q+1, and the remaining M−r sampling phases result in sampled waveforms of length Q; and overall, an average oversampling ratio of Q+r/M across the M sampling phases is achieved.

Thus, in order to perform direct over-sampled pulse-shaping when there is a non-integer (but rational) relationship between the data symbol (baud) rate and the desired sampling rate, M sampling phase versions of the sampled waveforms, $\{v_{XY}^p[m]\}_{m=0}^{m_{max}\{p\}}$, p=0, 1, 2, . . . M−1, of the four candidate current-positive waveforms, each of length Q or Q+1 (depending on p and M) are stored. For any given data symbol window, the appropriate sampling phase version is chosen, as well as the appropriate current-positive waveform (based on the previous, current and next data symbols), and, optionally, a negation is performed based on the value of the current data symbol.

Figure 5:
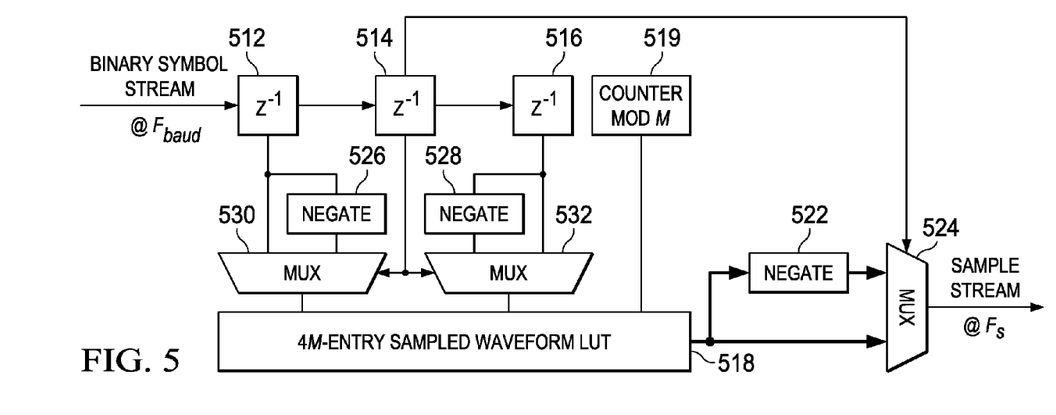
FIG. 5 is a block diagram of an alternative example embodiment of the direct oversampled pulse shaping block of FIG. 3 in which the desired sampling rate of the pulse shaped stream is related to the data symbol rate (baud rate) by a rational, non-integer scale-factor.

As shown in FIG. 5, a factor M, related to the ratio of the desired output sampling rate $F_s$ to the data symbol (baud) rate $F_{baud}$ represents the number of possible sampling phases for each candidate waveform in any data symbol window. Since the ratio of the output rate to the input rate is not an integer, multiple phases of each of the candidate waveforms are stored and modular counter 519 is also used to address LUT 518. Flip flop 516 passes the previous symbol and its negated version to MUX 532 and flip flop 512 passes the next symbol and its negated version to MUX 530 with the multiplexer outputs being passed to LUT 518. MUXes 530 and 532 select the negative versions of their respective inputs when the current symbol passed from flip flop 514 is negative. Flip flop 514 also passes the current symbol as the sign bit to MUX 524. The output of MOD M counter 519 selects the sampling phase of the waveform from LUT 518 with 4×M entries (4 possible current-positive waveforms sampled at M possible sampling phases). The appropriate waveform is sent from LUT 518 to MUX 524 along with the negative waveform after being negated by negate block 522. MUX 524 selects the appropriate waveform from the positive and negative waveforms based on the current data symbol passed from flip flop 514.

In a typical transmitter, the power consumption is dominated by the power amplifier (PA) saturation power (Psat) requirements. For example, reducing just 1 dB in the PA Psat requirement may reduce the overall transmit power consumption by as much as 20%. In turn, the $P_{sat}$ requirement of the PA is driven by the peak-to-average power ratio (PAR) of the modulated base-band signal, which is a strong function of the pulse shape employed. A low PAR pulse shape which reduces the PAR of the modulated baseband signal, and thus the PA Psat requirement, is disclosed. The disclosed low PAR pulse shape may be used with direct over-sampled pulse-shaping by choosing $p_c(t)$ to generate the low PAR pulse shape, by storing the appropriate waveforms into the LUT.

In typical IEEE 802.11b and other single carrier systems, a root raised cosine (RRC) pulse shaping filter has typically been used to shape the output spectrum. The impulse response of the RRC pulse may be given by $$p_{rrc}(t) = \frac{4\alpha}{\pi\sqrt{T}}\left(\frac{\cos\left(\frac{(1+\alpha)\pi t}{T}\right) + \sin\left(\frac{(1-\alpha)\pi t}{4\pi t}\right)}{\left(1 - \left(\frac{4\alpha t}{T}\right)^2\right)}\right)$$

where α is the roll-off factor and T is the pulsing period, which, in a system employing DSSS spreading (such as 802.11b), is the chipping period $T_c$. The roll-off factor $\alpha$ takes values between 0 and 1 and controls the spectral response of the filter in the frequency domain. The bandwidth of the filter in the frequency domain is in the order of $(1+\alpha)/T$. Choosing higher values of $\alpha$ implies occupying higher bandwidth.

Typically, in single carrier communication systems, an RRC pulse shape is chosen at the transmitter so that an RRC pulse shape at the receiver forms a matched filter to it. The RRC pulse does not have zero inter-symbol interference (ISI) by itself, so it will degrade the SNR (and equivalently, error vector magnitude (EVM)) due to interference from past and future symbols at the transmitter. However, when the RRC pulse at the transmitter is matched with another RRC with the same roll off factor at the receiver, an ISI system is formed leading to maximization of the SNR for decoding.

The PAR of the RRC pulse shape determines the PAR of the 802.11b signal. For example, the PAR of an 802.11b signal due to RRC pulse shaping may typically be 3.2 dB. For a linear PA, or an effectively linearized PA (in which digital pre-distortion (DPD) is used, if needed, to linearize the PA), the maximum 802.11b output power $P_{max}$ is kept 4 dB lower than the Psat in order to meet the transmitter emission mask if an RRC pulse shape is used. This 4 dB back-off from Psat is directly related to the PAR of the pulse shape. If lower PAR pulse shapes can be found, this back-off can be reduced.

In OFDM signals, clipping the signal above a particular PAR is effective because the instantaneous peak is rarely reached and the probability of instantaneous signal power being in the range of (PAR-2 dB) and PAR is <1%. However, in single carrier systems such as 802.11b, since the PAR is only 3.2 dB, the probability of instantaneous signal power being in the range of (PAR-1 dB) to PAR is approximately 10% and clipping the signal to reduce the PAR degrades the transmission spectrum significantly. Clipping to reduce PAR by even 1 dB causes significant distortion to the signal, which violates IEEE transmission mask and EVM requirements.

Example embodiments of a low PAR pulse shaping filter are disclosed which reduce the peak-to-average ratio (PAR) of the transmitted 802.11b signal by 1.5 dB, which translates to ~25% savings in power consumption due to 1.5 dB reduction in Psat requirement for the 802.11b transmitter. Alternately, for a given Psat, with this new scheme, 1.5 dB higher output power can be transmitted for 802.11b signals, thus increasing the range of the network. With the example embodiments, the 802.11b signals comply with the IEEE spectral emission mask and EVM requirements. This low PAR pulse-shape may be used in other single carrier systems as well, for similar benefits and no restriction is implied by the presentation herein, which focuses on the specific example of 802.11b for simplicity of exposition.

For an RRC pulse, the PAR of the signal is greater than or equal to 3.2 dB for any roll-off factor. Another typical pulse shape that may be used in single carrier systems is the raised cosine (RC) filter. The frequency response of the RRC is the square root of the frequency response of the RC filter, hence the name. The impulse response of the RC filter is $$p_{rc}(t) = \frac{\sin \pi t}{\frac{\pi t}{T}} \frac{\cos \frac{\pi \alpha t}{T}}{\left(1 - \left(\frac{4\alpha^2 t^2}{T^2}\right)\right)}$$

where $\alpha$ is the roll-off factor and has the same significance as in the RRC filter. An important property of the RC filter is that it causes no ISI in the signal. Choosing this pulse will always result in better EVM performance at the transmitter due to no ISI. However, there may be slight EVM degradation at the receiver depending on the receive filter employed.

The PAR with RC pulse shows a significant change as a function of roll-off factor. An RRC pulse has a PAR of greater than or equal to 3 dB for any roll-off factor. However, a combination of RC and RRC may achieve lower PARs. A pulse shape generated as a weighted combination of RC and RRC pulses has slightly lower PAR than the RC pulse itself.

Let $p_{rc}(t)$ denote an RC pulse, $p_{rrc}(t)$ denote an RRC pulse, and $\alpha$ denote the roll-off factors. The disclosed pulse shape, obtained as a linear combination of RC and RRC, may be given by $$p_c(t) = \beta * p_{rc}(t) + (1-\beta) * p_{rrc}(t)$$

Figure 6:
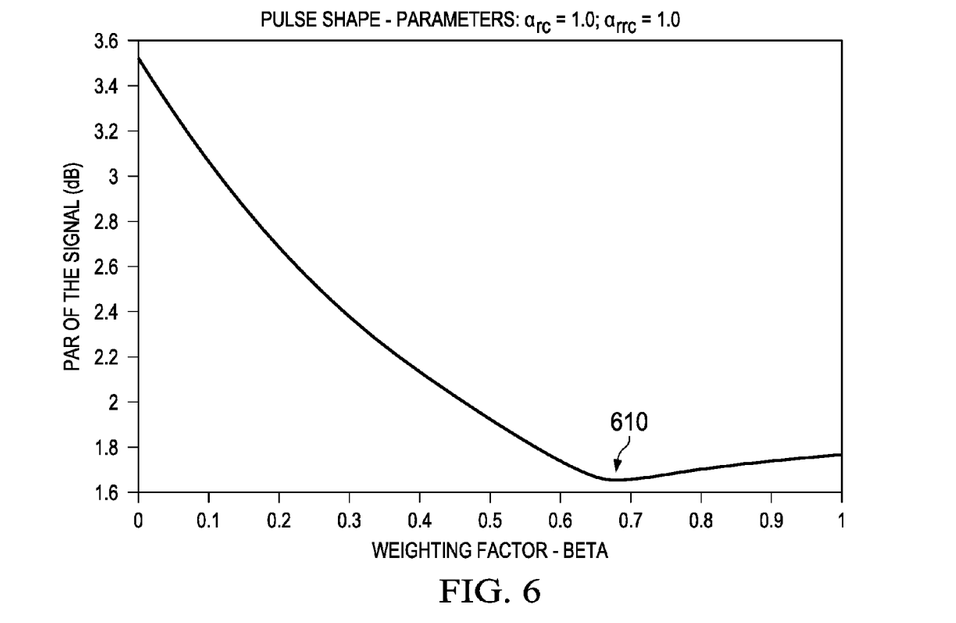
FIG. 6 is a signal diagram of a PAR of an example baseband signal for various weighting factor values.

A choice of $\beta=0.7$ for $\alpha_{rc}=\alpha_{rrc}=1$ for both the RRC and RC pulse shapes provides the lowest PAR of 1.67 dB as shown in FIG. 6. In the disclosed pulse shape, the RC filter has higher weighting than the RRC pulse. The disclosed pulse shape provides very good EVM due to no ISI. The minimum PAR is achieved at area 610.

Figure 8:
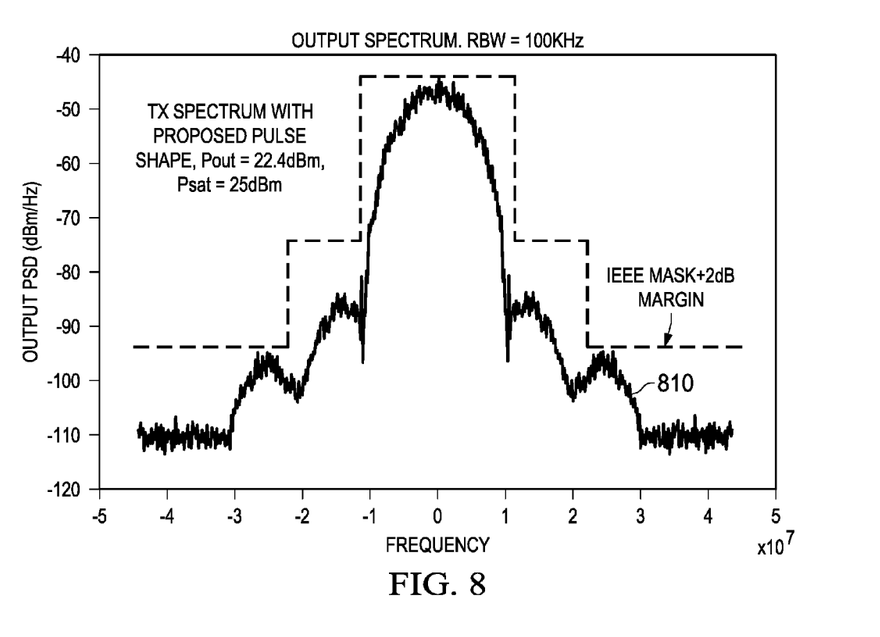
FIG. 8 is a signal diagram of the output spectrum of an example signal using a low PAR pulse shape.

The transmission output spectrum with the disclosed pulse shape meets the IEEE mask and also achieves higher output power for the same $P_{sat}$ as shown in FIG. 8. The WLAN 802.11b spectral mask specification is given a 2 dB margin. With the low PAR pulse-shape filter of the disclosed example embodiments, the specification is met by signal 810, with as little as 2.6 dB gap between output power and $P_{sat}$.

Figure 7:
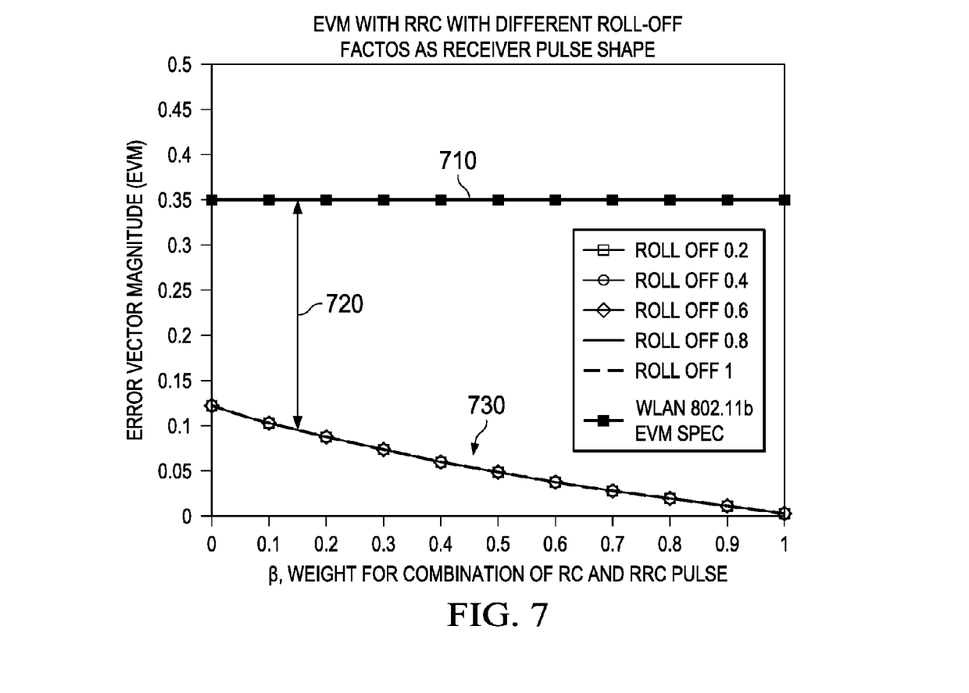
FIG. 7 is a signal diagram of the Error Vector Magnitude (EVM) of an example signal in the presence of typical RRC filtering for various weighting factor values.

FIG. 7 shows the net EVM performance of the proposed pulse shape when an "unmatched" receive filter is used, which might typically be an RRC pulse shape of any roll-off factor. In all cases, IEEE WLAN EVM specification for 802.11b DSSS modes 710 is met with margin 720. EVM 730 results from using the disclosed pulse shape at the transmitter for various typical receive-side filters (RRC filters with different roll-offs).

Example embodiments of the systems and methods of direct over-sampled pulse shaping disclosed herein offer significant power savings over previous methods. In an example implementation, for example, an 8× power reduction may be achieved. Where a system based on a previously existing filter/re-sampler implementation may consume 2.6 mA at 1.2V, a system using the LUT based implementation disclosed herein may consume 0.3 mA at 1.2V.

Figure 9:
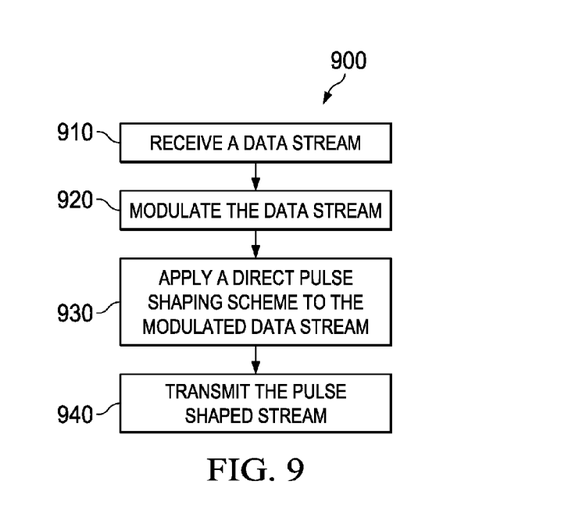
FIG. 9 is a flow diagram of an example embodiment of a method of low PAR direct oversampled pulse shaping.

FIG. 9 provides an example embodiment of method 900 of direct over sampled low PAR pulse shaping. In block 910, a data stream is received and is sent for modulation in block 920. In block 930, the modulated data symbol stream is received and a low PAR direct pulse shaping scheme is applied to the modulated data symbol stream. In block 940, the pulse shaped stream is frequency up-converted and transmitted.

The flow chart of FIG. 9 shows the architecture, functionality, and operation of a possible implementation of the pulse shaping. In this regard, each block represents a module, segment, or portion of code, which comprises one or more executable instructions for implementing the specified logical function(s). It should also be noted that in some alternative implementations, the functions noted in the blocks may occur out of the order noted in FIG. 9. For example, two blocks shown in succession in FIG. 9 may in fact be executed substantially concurrently or the blocks may sometimes be executed in the reverse order, depending upon the functionality involved. Any process descriptions or blocks in flow charts should be understood as representing modules, segments, or portions of code which include one or more executable instructions for implementing specific logical functions or steps in the process, and alternate implementations are included within the scope of the example embodiments in which functions may be executed out of order from that shown or discussed, including substantially concurrently or in reverse order, depending on the functionality involved. In addition, the process descriptions or blocks in flow charts should be understood as representing decisions made by a hardware structure such as a state machine.

The logic of the example embodiment(s) can be implemented in hardware, software, firmware, or a combination thereof. In example embodiments, the logic is implemented in software or firmware that is stored in a memory and that is executed by a suitable instruction execution system. If implemented in hardware, as in an alternative embodiment, the logic can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In addition, the scope of the present disclosure includes embodying the functionality of the example embodiments disclosed herein in logic embodied in hardware or software-configured mediums.

Software embodiments, which comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, or communicate the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of the computer-readable medium would include the following: a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical). In addition, the scope of the present disclosure includes embodying the functionality of the example embodiments of the present disclosure in logic embodied in hardware or software-configured mediums.

Although the present invention has been described in detail, it should be understood that various changes, substitutions and alterations can be made thereto without departing from the spirit and scope of the invention as defined by the appended claims.

Therefore, at least the following is claimed:

1. A system comprising:
    a pulse shaper configured to receive a modulated data symbol stream and to apply direct over-sampled pulse shaping encapsulating Direct Sequence Spread Spectrum (DSSS) spreading, using a lookup table (LUT), to the data symbol stream to produce an oversampled baseband signal at a desired sampling rate, the pulse shaper including a plurality of flip flops configured to access the LUT,
    a first flip flop of the plurality of flip flops configured to access the LUT corresponding to a next data symbol of a three symbol sequence of the data symbol stream,
    a second flip flop of the plurality of flip flops configured to access the LUT corresponding to a previous data symbol of a three symbol sequence of the data symbol stream, and
    a third flip flop of the plurality of flip flops configured to access the LUT for a current data symbol of a three symbol sequence of the data symbol stream and to select the output of the LUT or the negative of the output of the LUT; and
    a transmitter configured to transmit the oversampled baseband signal.

2. The system of claim 1, wherein the pulse shaper is configured to:
    present the direct over-sampled pulse shaping from the LUT at an oversampling rate of an integer multiple of an input symbol rate; or
    if a desired output sampling rate of the direct oversampled pulse shaping scheme is a rational non-integer multiple of an input symbol rate, access the LUT with a modulo M counter, where M is related to a ratio of the desired oversampled output rate and the input symbol rate.

3. A direct over-sampled pulse shaping circuit for a data symbol stream comprising:
    (a) a first flip flop passing a previous symbol and a negated version of the previous symbol to a first multiplexer that has a control input and an output;
    (b) a second flip flop passing a next symbol and a negated version of the next symbol to a second multiplexer that has a control input and an output;
    (c) a look up table circuit having inputs connected to the outputs of the multiplexers and passing a waveform output and a negated version of the waveform output to a third multiplexer that has a control input;
    (d) a third flip flop passing a current symbol and having a control output connected to the control inputs of the first and second multiplexers, the third flip flop selecting the negated versions of the previous symbol and the next symbol when the current symbol passed from the third flip flop is negative, the control output of the third flip flop also being connected to the control input of the third multiplexer to select an appropriate waveform from the look up table.

4. The circuit of claim 3 including a modulo M counter connected to the look up table circuit.

* * * * *